United States Patent
Liu (10) Patent No.: US 10,600,556 B2
(45) Date of Patent: Mar. 24, 2020

(54) INDUCTOR STRUCTURE

(71) Applicant: Vanguard International Semiconductor Corporation, Hsinchu (TW)

(72) Inventor: Chia-Shen Liu, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 114 days.

(21) Appl. No.: 15/861,978

(22) Filed: Jan. 4, 2018

(65) Prior Publication Data

US 2019/0206609 A1    Jul. 4, 2019

(51) Int. Cl.
| | | |
|---|---|---|
| *H01F 27/28* | (2006.01) | |
| *H01F 27/29* | (2006.01) | |
| *H01L 49/02* | (2006.01) | |
| *H01F 27/34* | (2006.01) | |
| *H01F 17/00* | (2006.01) | |

(52) U.S. Cl.
CPC ..... *H01F 27/2828* (2013.01); *H01F 17/0013* (2013.01); *H01F 27/292* (2013.01); *H01F 27/346* (2013.01); *H01L 28/10* (2013.01); *H01F 2017/0073* (2013.01)

(58) Field of Classification Search
USPC ................................................ 336/225, 226
See application file for complete search history.

(56) References Cited

U.S. PATENT DOCUMENTS

2003/0085790 A1*  5/2003  Farine .................... H01F 5/003
                                                                        336/225
2014/0077919 A1*  3/2014  Godoy .................. H01F 27/006
                                                                        336/220

FOREIGN PATENT DOCUMENTS

TW              I579997 B        4/2017

OTHER PUBLICATIONS

Taiwanese Notice of Allowance and Search Report for Taiwanese Application No. 106138416, dated Mar. 15, 2018.

* cited by examiner

*Primary Examiner* — Ronald Hinson
(74) *Attorney, Agent, or Firm* — Birch, Stewart, Kolasch & Birch, LLP (57) ABSTRACT

An inductor structure formed on a substrate and extending in a quadrant comprising a first domain, a second domain, a third domain and a fourth domain is provided. The inductor structure comprises an input conducting wire, an output conducting wire and a conducting wire. The conducting wire is coupled between the input conducting wire and the output conducting wire. A first portion of the conducting wire is extended from a start terminal, to the second domain, to the fourth domain, to a stop terminal. A second portion of the conducting wire is extended from the start terminal, to the third domain, to the first domain, to the stop terminal.

17 Claims, 11 Drawing Sheets

INDUCTOR STRUCTURE

BACKGROUND OF THE INVENTION

Field of the Invention

The invention relates to a semiconductor structure, and more particularly to an inductor structure.

Description of the Related Art

An inductor is capable of transforming electrical energy into magnetic energy and storing the magnetic energy. To reduce the size of an electronic apparatus, the majority of inductors are produced by a semiconductor manufacturing process. However, the size of an inductor integrated into an integrated circuit (IC) is generally quite large. A conventional method of reducing the size of the inductor is to change the layout pattern of the inductor. However, the layout pattern of the inductor relates to the distribution of magnetic force lines of the inductor. When the distribution of magnetic force lines of the inductor is not perfect, the quality factor of the inductor is reduced.

BRIEF SUMMARY OF THE INVENTION

In accordance with an embodiment, an inductor structure is formed on a substrate and disposed in a first region, a second region, a third region and a fourth region. The first region comprises a first boundary, a second boundary, a third boundary and a fourth boundary. The second region comprises a fifth boundary, a sixth boundary, a seventh boundary and an eighth boundary. The third region comprises a ninth boundary, a tenth boundary, an eleventh boundary and a twelfth boundary. The fourth region comprises a thirteenth boundary, a fourteenth boundary, a fifteenth boundary and a sixteenth boundary. The inductor structure comprises an input conducting line, an output conducting line and a conducting line. The conducting line is connected between the input conducting line and the output conducting line and comprises a first portion and a second portion. The first portion is sequentially extended along the first, the third, the thirteenth, the sixteenth, the sixth, the eighth, the tenth and the eleventh boundaries. The second portion is sequentially extended along the ninth, the twelfth, the fifth, the seventh, the fourteenth, the fifteenth, the second and the fourth boundaries. The first boundary is parallel to the second boundary. The third boundary is parallel to the fourth boundary. The first and second boundaries are vertical to the third and the fourth boundaries. The fifth boundary is parallel to the sixth boundary. The seventh boundary is parallel to the eighth boundary. The fifth and sixth boundaries are vertical to the seventh and the eighth boundaries. The ninth boundary is parallel to the tenth boundary. The eleventh boundary is parallel to the twelfth boundary. The ninth and tenth boundaries are vertical to the eleventh and the twelfth boundaries. The thirteenth boundary is parallel to the fourteenth boundary. The fifteenth boundary is parallel to the sixteenth boundary. The thirteenth and fourteenth boundaries are vertical to the fifteenth and the sixteenth boundaries.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
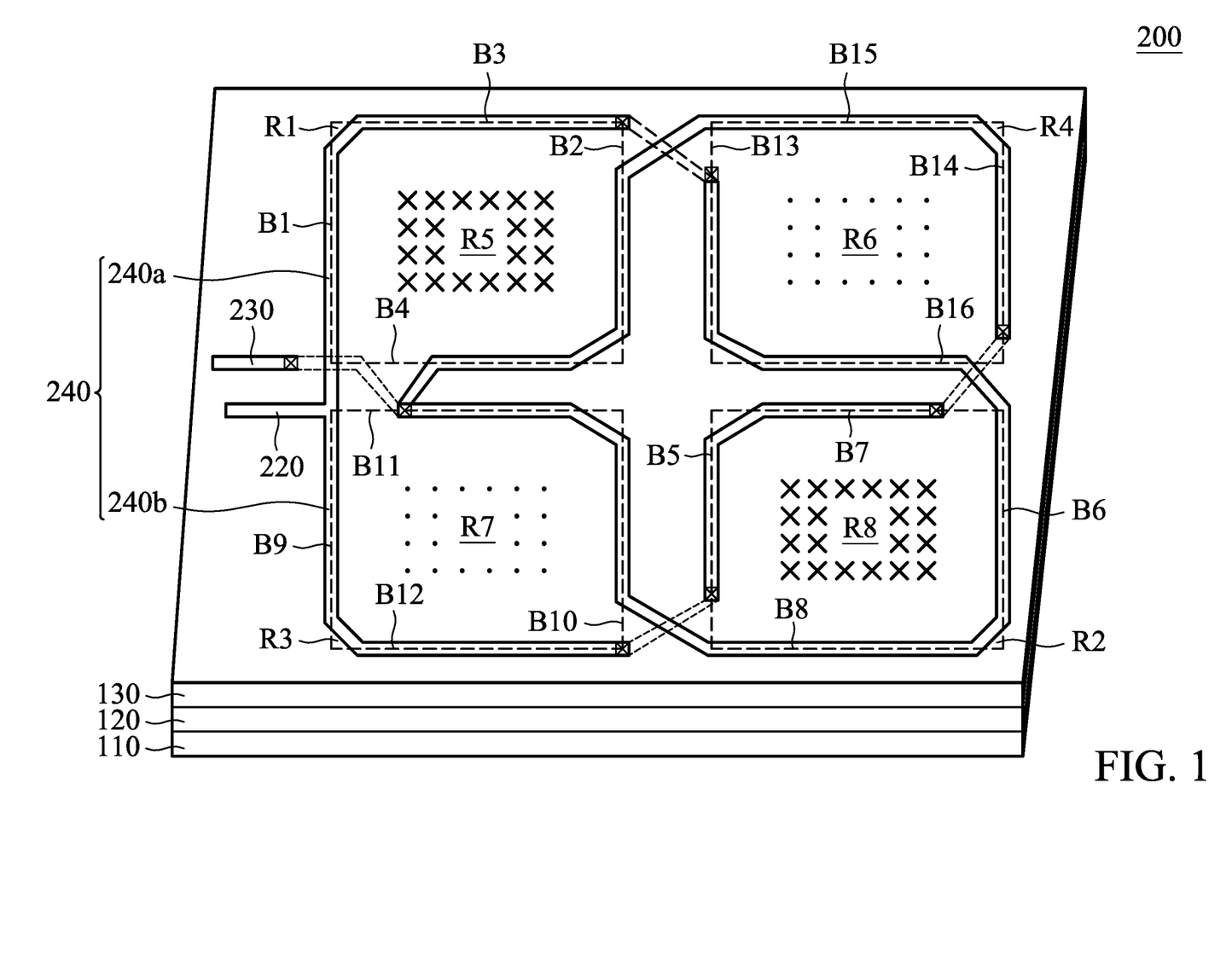
FIG. 1 is a schematic diagram of an exemplary embodiment of an inductor structure, according to various aspects of the present disclosure.

FIG. 1 is a schematic diagram of an exemplary embodiment of an inductor structure, according to various aspects of the present disclosure. The inductor structure 200 is formed on a substrate 110 and extended in regions R1~R4. The region R1 neighbors upon the regions R3 and R4. The region R1 is located in the left-side of the region R4 and in the top-side of the region R3. The region R2 neighbors upon the regions R3 and R4. The region R2 is located in the bottom-side of the region R4 and in the right-side of the region R3. The region R3 neighbors upon the regions R1 and R2. The region R3 is located in the bottom-side of the region R1 and in the left-side of the region R2. The region R4 neighbors upon the regions R1 and R2. The region R4 is located in the right-side of the region R1 and in the top-side of the region R2.

The region R1 has boundaries B1~B4. The boundary B1 is parallel to the boundary B2. The boundary B3 is parallel to the boundary B4. The boundaries B1 and B2 are vertical to the boundaries B3 and B4. In this embodiment, the boundary B2 is closer the region R4 than the boundary B1. In addition, the boundary B4 is closer the region R3 than the boundary B3. The region R2 has boundaries B5~B8. The boundary B5 is parallel to the boundary B6. The boundary B7 is parallel to the boundary B8. The boundaries B5 and B6 are vertical to the boundaries B7 and B8. In this embodiment, the boundary B5 is closer the region R3 than the boundary B6. In addition, the boundary B7 is closer the region R4 than the boundary B8.

The region R3 has boundaries B9~B12. The boundary B9 is parallel to the boundary B10. The boundary B11 is parallel to the boundary B12. The boundaries B9 and B10 are vertical to the boundaries B11 and B12. In this embodiment, the boundary B10 is closer the region R2 than the boundary B9. In addition, the boundary B11 is closer the region R1 than the boundary B12. The region R4 has boundaries B13~B16. The boundary B13 is parallel to the boundary B14. The boundary B15 is parallel to the boundary B16. The boundaries B13 and B14 are vertical to the boundaries B15 and B16. In this embodiment, the boundary B13 is closer the region R1 than the boundary B14. In addition, the boundary B16 is closer the region R2 than the boundary B15.

The inductor structure 200 comprises an input conducting line 220, an output conducting line 230 and a conducting line 240. The input conducting line 220 and the output conducting line 230 are formed in a metal layer 130. The conducting line 240 is electrically connected between the input conducting line 220 and the output conducting line 230 and extended in the metal layers 120 and 130. As shown in FIG. 1, the metal layer 120 is disposed between the substrate 110 and the metal layer 130. In one embodiment, an insulating layer (not shown) is disposed between the metal layers 120 and 130.

The materials of the metal layers 120 and 130 are not limited in the present invention. In one embodiment, the material of each of the metal layers 120 and 130 is aluminum or cuprum, however, the invention is not limited thereto. In other embodiments, any material can serve as the metal layer 120 or 130, as long as the material is capable of conducting electricity. Furthermore, the material of the metal layer 120 may be the same as or different from the material of the metal layer 130.

In this embodiment, the conducting line 240 comprises a first portion 240a and a second portion 240b. In one embodiment, the first portion 240a of the conducting line 240 is electrically connected to the input conducting line 220. The first portion 240a is sequentially extended along the boundaries B1 and B3 of the region R1, the boundaries B13 and B16 of the region R4, the boundaries B6 and B8 of the region R2, and enters the region R3. Then, the first portion 240a is sequentially extended along the boundaries B10 and B11 of the region R3 and finally connected to the output conducting line 230. Furthermore, the second portion 240b of the conducting line 240 is electrically connected to the input conducting line 220. The second portion 240b is sequentially extended along the boundaries B9 and B12 of the region R3 and enters the region R2. Then, the second portion 240b is sequentially extended along the boundaries B5 and B7 of the region R2 and enters the region R4. Then, the second portion 240b is extended along the boundaries B14 and B15 of the region R4 and enters the region R1. Then, the second portion 240b is extended along the boundaries B2 and B4 of the region R1 and finally connected to the output conducting line 230.

In this embodiment, the first portion 240a and the second portion 240b of the conducting line 240 define the scopes of the regions R5~R8. The region R5 is approximately located in the center of the region R1. The region R6 is approximately located in the center of the region R4. The region R7 is approximately located in the center of the region R3. The region R8 is approximately located in the center of the region R2. When the input conducting line 220 receives an input current, the input current flows to the first portion 240a and the second portion 240b and finally outputs from the output conducting line 230.

In FIG. 1, the symbols X and . represent the direction of the magnetic field. In this case, the directions of the magnetic fields in the regions R5 and R8 are from the metal layer 130 to the substrate 110, and the directions of the magnetic fields in the regions R6 and R7 are from the substrate 110 to the metal layer 130. The distribution of magnetic force lines of the inductor structure 200 can be adjusted according to the extended direction of the conducting line 240 to avoid consuming magnetic force on the substrate 110. Therefore, the quality factor (Q factor) is increased and noise interference can be reduced. Furthermore, the layout space of the inductor structure 200 is reduced.

Figure 2A:
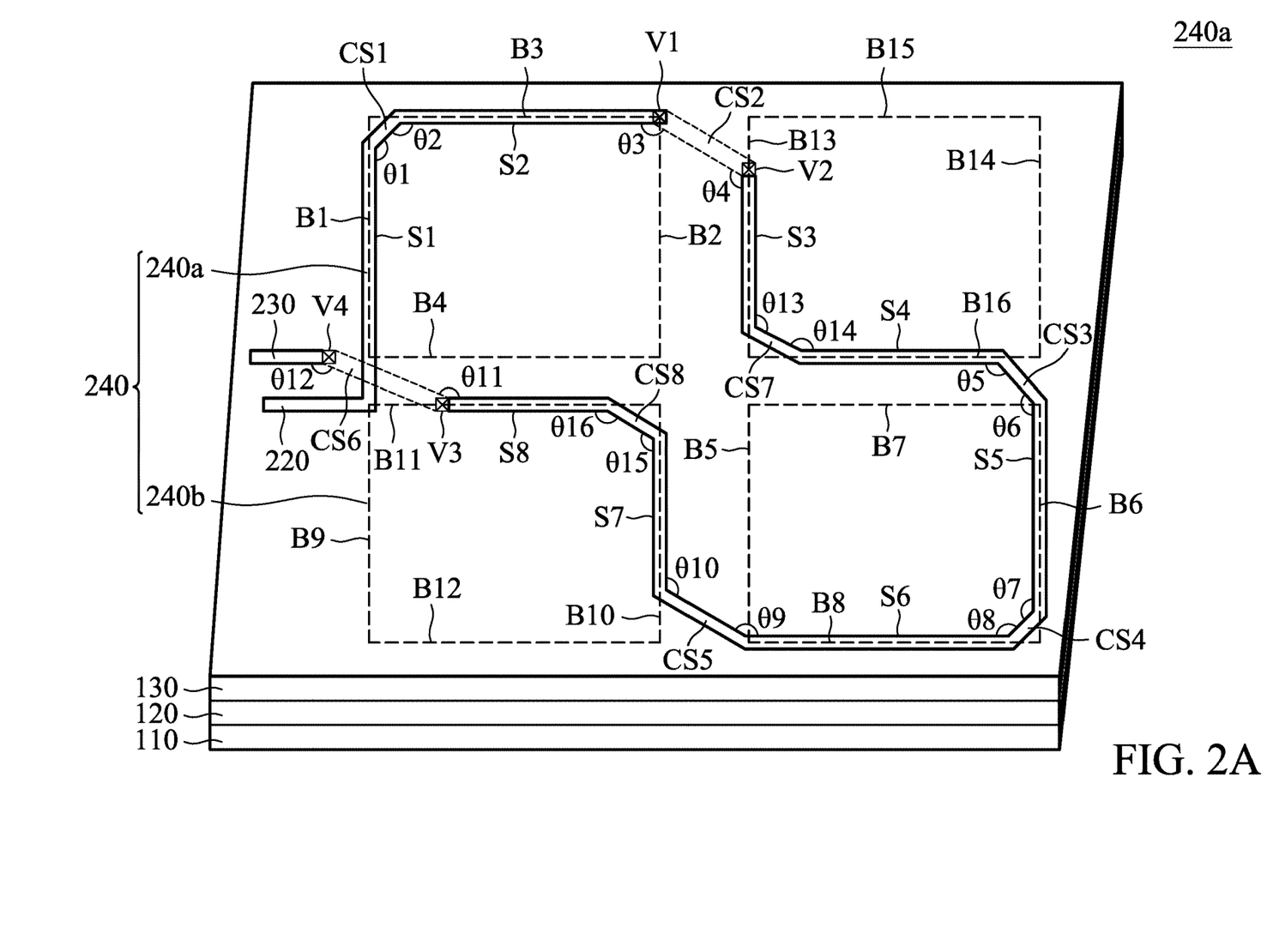
FIG. 2A is a schematic diagram of an exemplary embodiment of a first portion of a conducting line, according to various aspects of the present disclosure.

FIG. 2A is a schematic diagram of an exemplary embodiment of the first portion 240a of the conducting line 240, according to various aspects of the present disclosure. As shown in FIG. 2A, the first portion 240a of the conducting line 240 comprises segments S1~S8 and connection segments CS1~CS8. The segment S1 is directly connected to the input conducting line 220 and extended along the boundary B1. In this embodiment, the segment S1 is parallel to the boundary B1. The segment S2 is extended along the boundary B3. As shown in FIG. 2A, the segment S2 is parallel to the boundary B2. The connection segment CS1 is connected between the segments S1 and S2. In one embodiment, the connection segment CS1, the segments S1 and S2 are disposed in the same metal layer, such as the metal layer 130. In other embodiments, the metal layer comprising the connection segment CS1 is different from the metal layer comprising the segments S1 and S2. For example, the connection segment CS1 may be formed in the metal layer 120 and the segments S1 and S2 are formed in the metal layer 130. In this embodiment, an angle θ1 is between the connection segment CS1 and the segment S1. An angle θ2 is between the connection segment CS1 and the segment S2. In one embodiment, the angles θ1 and θ2 are greater than 90 degrees. In another embodiment, the angle θ1 is equal to the angle θ2.

The segment S3 is extended along the boundary B13. In this embodiment, the segment S3 is parallel to the boundary B3. The connection segment CS2 is connected between the segments S2 and S3. In one embodiment, the connection segment CS2 is formed in a metal layer which is different from the metal layer having the segments S2 and S3. For example, the connection segment CS2 may be formed in the metal layer 120, and the segments S2 and S3 may be formed in the metal layer 130. In this case, the segments S2 and S3 are electrically connected to the connection segment CS2 formed in the metal layer 120 via the holes V1 and V2 respectively. In another embodiment, the connection segment CS2, the segments S2 and S3 are formed in the same metal layer. For example, the connection segment CS and the segments S2 and S3 are formed in the metal layer 130. As shown in FIG. 2A, an angle θ3 is between the connection segment CS2 and the segment S2, and an angle θ4 is between the connection segment CS2 and the segment S3. In this embodiment, the angles θ3 and θ4 are greater than 90 degrees. In one embodiment, the angle θ3 is equal to the angle θ4.

The segment S4 is extended along the boundary B16. In this embodiment, the segment S4 is parallel to the boundary B16. The connection segment CS7 is connected between the segments S3 and S4. In one embodiment, the connection segment CS7 and the segments S3 and S4 are disposed in the same metal layer, but the disclosure is not limited thereto. In other embodiment, the connection segment CS7 is formed in a metal layer that is different from the metal layer comprising the segments S3 and S4. For example, the connection segment CS7 is formed in a first metal layer, and the segments S3 and S4 are formed in a second metal layer that is formed on the first metal layer. An angle θ13 is between the connection segment CS7 and the segment S3. An angle θ14 is between the connection segment CS7 and the segment S4. In this embodiment, the angle θ13 and the angle θ14 are greater than 90 degrees. In one embodiment, the angle θ13 is equal to the angle θ14.

The segment S5 is extended along the boundary B6. In this embodiment, the segment S5 is parallel to the boundary B6. The connection segment CS3 is connected between the segments S4 and S5. In one embodiment, the connection segment CS3 and the segments S4 and S5 are disposed in the same metal layer, such as the metal layer 130. In another embodiment, the metal layer comprising the connection segment CS3 is different from the metal layer comprising the segments S4 and S5. For example, the connection segment CS3 may be disposed in the metal layer 120. In this case, the segments S4 and S5 are disposed in the metal layer 130. An angle θ5 is between the connection segment CS3 and the segment S4. An angle θ6 is between the connection segment CS3 and the segment S5. In this embodiment, both the angles θ5 and θ6 are greater than 90 degrees. In one embodiment, the angle θ5 is equal to the angle θ6.

The segment S6 is extended along the boundary B8. In this embodiment, the segment S6 is parallel to the boundary B8. The connection segment CS4 is connected between the segments S5 and S6. In one embodiment, the metal layer where the connection segment CS4 is disposed may be the same as or different from the metal layer wherein the segments S5 and S6 are disposed. An angle θ7 is between the connection segment CS4 and segment S5. An angle θ8 is between the connection segment CS4 and the segment S6. In this embodiment, the angles θ7 and θ8 are greater than 90 degrees. In one embodiment, the angle θ7 is equal to the angle θ8.

The segment S7 is extended along the boundary B10. In this embodiment, the segment S7 is parallel to the boundary B10. The connection segment CS5 is connected between the segments S6 and S7. In one embodiment, the metal layer where the connection segment CS5 is disposed may be the same as or different from the metal layer wherein the segments S6 and S7 are disposed. An angle θ9 is between the connection segment CS5 and segment S6. An angle θ10 is between the connection segment CS5 and the segment S7. In this embodiment, the angles θ9 and θ10 are greater than 90 degrees. In one embodiment, the angle θ9 is equal to the angle θ10.

The segment S8 is extended along the boundary B11 and connected to the output conducting line 230. In this embodiment, the segment S8 is parallel to the boundary B11. The connection segment CS8 is connected between the segments S7 and S8. In one embodiment, the metal layer where the connection segment CS8 is disposed may be the same as or different from the metal layer wherein the segments S7 and S8 are disposed. An angle θ15 is between the connection segment CS8 and segment S7. An angle θ16 is between the connection segment CS7 and the segment S8. In this embodiment, the angles θ15 and θ16 are greater than 90 degrees. In one embodiment, the angle θ15 is equal to the angle θ16.

The connection segment CS6 is connected between the segment S8 and the output conducting line 230. In this embodiment, the connection segment CS6 may be disposed in a metal layer which is different from the metal layer that comprises the segment S8 and the output conducting line 230. For example, the connection segment CS6 may be disposed in the metal layer 120, and the segment S8 and the output conducting line 230 are disposed in the metal layer 130. In this case, the segment S8 and the output conducting line 230 are electrically connected to the connection segment CS6 disposed in the metal layer 120 via the holes V3 and V4 respectively. An angle θ11 is between the connection segment CS6 and the segment S8. An angle θ12 is between the connection segment CS6 and the output conducting line 230. In this embodiment, the angles θ11 and θ12 are greater than 90 degrees. In one embodiment, the angle θ11 is equal to the angle θ12.

Figure 2B:
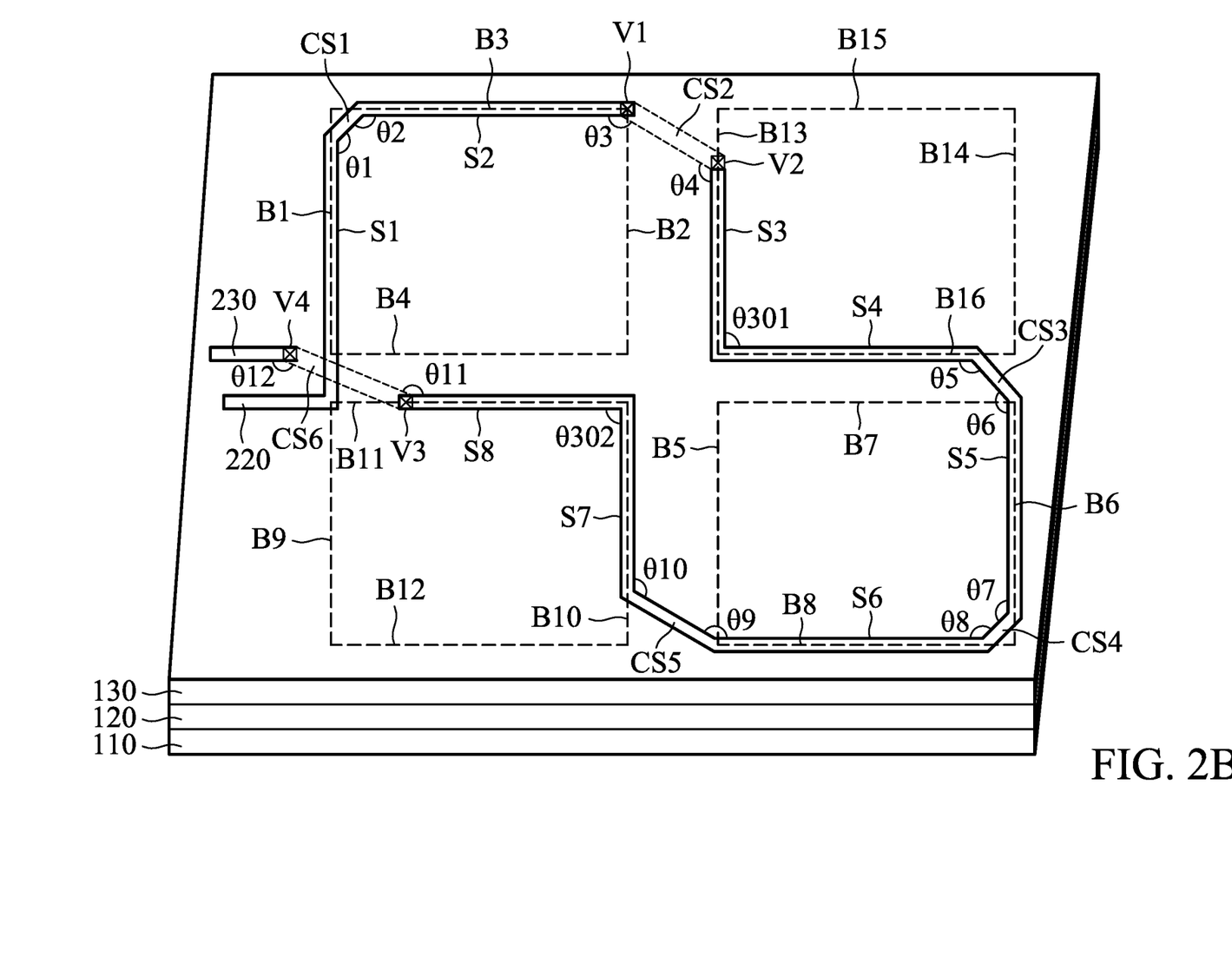
FIG. 2B is a schematic diagram of another exemplary embodiment of the first portion of the conducting line, according to various aspects of the present disclosure.

FIG. 2B is a schematic diagram of another exemplary embodiment of the first portion 240a of the conducting line 240, according to various aspects of the present disclosure. FIG. 2B is similar to FIG. 2A, with the exception that the segment S3 shown in FIG. 2B is directly connected to the segment S4 and the segment S7 is directly connected to the segment S8. In this embodiment, an angle θ301 is between the segments S3 and S4, and an angle θ302 is between the segments S7 and S8. In one embodiment, the angle θ301 is equal to the angle θ302. In another embodiment, the angle θ301 and angle θ302 are equal to 90 degrees.

Figure 2C:
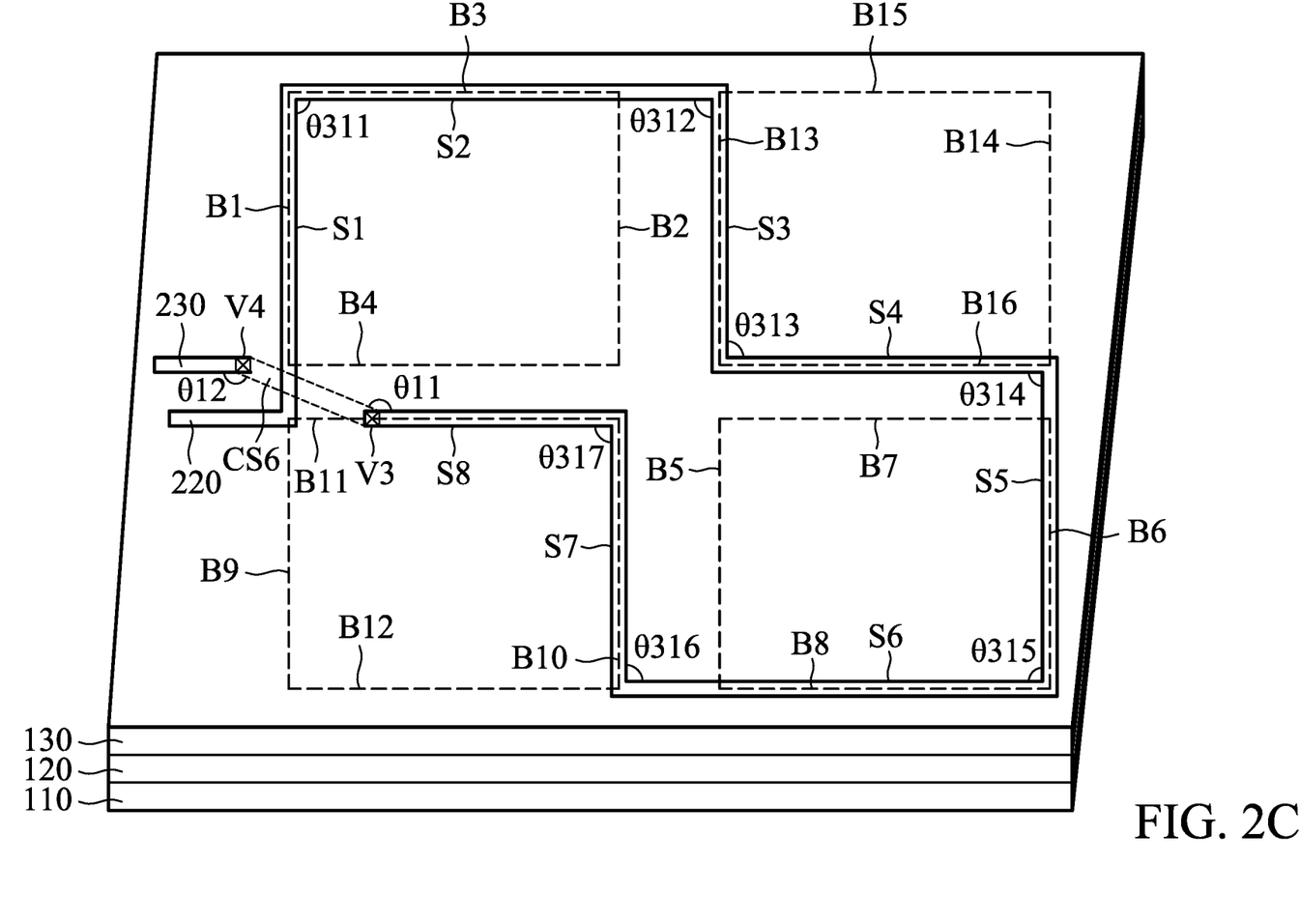
FIG. 2C is a schematic diagram of another exemplary embodiment of the first portion of the conducting line, according to various aspects of the present disclosure.

FIG. 2C is a schematic diagram of another exemplary embodiment of the first portion 240a of the conducting line 240, according to various aspects of the present disclosure. In this embodiment, the segment S2 is directly connected to the segment S1. An angle θ311 is between the segments S1 and S2. The segment S2 is directly connected to the segment S3. An angle θ312 is between the segments S2 and S3. The segment S3 is directly connected to the segment S4. An angle θ313 is between the segments S3 and S4. The segment S4 is directly connected to the segment S5. An angle θ314 is between the segments S4 and S5. The segment S5 is directly connected to the segment S6. An angle θ315 is between the segments S5 and S6. The segment S6 is directly connected to the segment S7. An angle θ316 is between the segments S6 and S7. The segment S7 is directly connected to the segment S8. An angle θ317 is between the segments S7 and S8. The segment S8 is connected to the output conducting line 230 via the connection segment CS6.

In this embodiment, the angles θ311~κ317 are the same. In one embodiment, the angles θ311~θ317 are equal to 90 degrees, but the disclosure is not limited thereto. In other embodiments, at least one of the angles θ311~θ317 is not equal to another of the angles θ311~θ317.

Figure 3A:
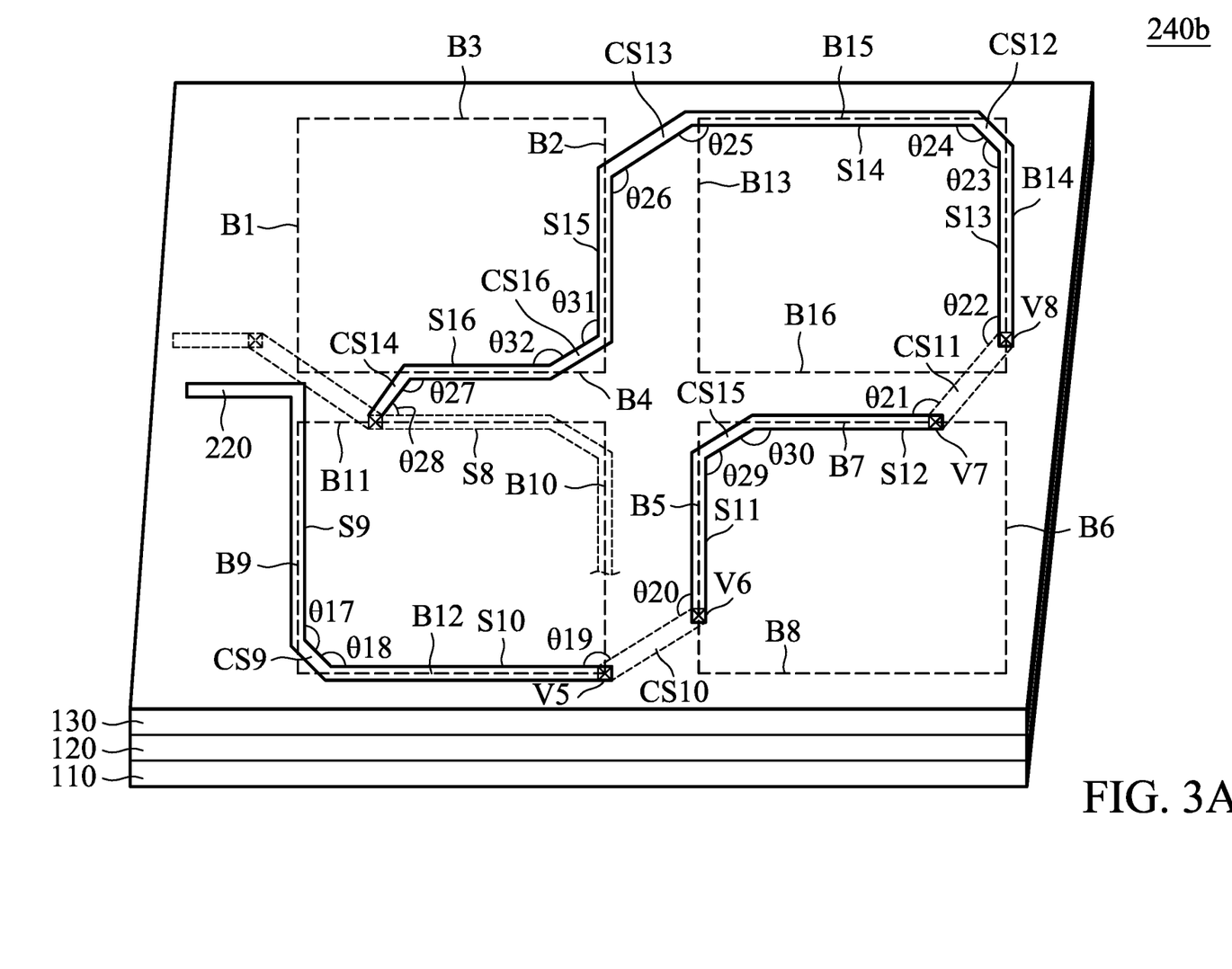
FIG. 3A is a schematic diagram of an exemplary embodiment of a second portion of a conducting line, according to various aspects of the present disclosure.

FIG. 3A is a schematic diagram of an exemplary embodiment of the second portion 240b of the conducting line 240, according to various aspects of the present disclosure. As shown in FIG. 3A, the second portion 240b of the conducting line 240 comprises segments S9~S16 and connection segments CS9~CS16. The segment S9 is directly connected to the input conducting line 220 and extended along the boundary B9. In this embodiment, the segment S9 is parallel to the boundary B9. The segment S10 is extended along the boundary B12. In this embodiment, the segment S10 is parallel to the boundary B12. The connection segment CS9 is connected between the segments S9 and S10. In one embodiment, the connection segment CS9 and the segments S1 and S2 are disposed in the same metal layer, such as the metal layer 130. In another embodiment, the metal layer comprising the connection segment CS9 is different from the metal layer comprising the segments S9 and S10. For example, the connection segment CS9 may be formed in the metal layer 120 and the segments S9 and S10 are formed in the metal layer 130. In this embodiment, an angle θ17 is between the connection segment CS9 and the segment S9. An angle θ18 is between the connection segment CS9 and the segment S1. In one embodiment, the angles θ17 and θ18 are greater than 90 degrees. In another embodiment, the angle θ17 is equal to the angle θ18.

The segment S11 is extended along the boundary B5. In this embodiment, the segment S11 is parallel to the boundary B5. The connection segment CS10 is connected between the segments S10 and S11. In one embodiment, the connection segment CS10 is formed in a metal layer which is the same as the metal layer having the segments S10 and S11. In one embodiment, the connection segment CS10, the segments S10 and S11 are disposed in the metal layer 130. In another embodiment, the metal layer comprising the connection segment CS10 is different from the metal layer comprising the segments S10 and S11. For example, the connection segment CS10 may be formed in the metal layer 120, and the segments S10 and S11 may be formed in the metal layer 130. In this case, the segments S10 and S11 are electrically connected to the connection segment CS10 formed in the metal layer 120 via the holes V5 and V6 respectively. An angle θ19 is between the connection segment CS10 and the segment S10. An angle θ20 is between the connection segment CS10 and the segment S11. In one embodiment, the angles θ19 and θ20 are greater than 90 degrees. In one embodiment, the angle θ19 is equal to the angle θ20.

The segment S12 is extended along the boundary B7. In this embodiment, the segment S12 is parallel to the boundary B7. The connection segment CS15 is connected between the segments S11 and S12. In one embodiment, the connection segment CS15 is formed in a metal layer which is the same as the metal layer having the segments S11 and S12. In one embodiment, the connection segment CS15, the segments S11 and S12 are disposed in the metal layer 130. In another embodiment, the metal layer comprising the connection segment CS15 is different from the metal layer comprising the segments S11 and S12. For example, the connection segment CS15 may be formed in the metal layer 120, and the segments S11 and S12 may be formed in the metal layer 130. Furthermore, an angle θ29 is between the connection segment CS15 and the segment S11. An angle θ30 is between the connection segment CS15 and the segment S12. In this embodiment, the angles θ29 and θ30 are greater than 90 degrees. In one embodiment, the angle θ29 is equal to the angle θ30.

The segment S13 is extended along the boundary B14. In this embodiment, the segment S13 is parallel to the boundary B14. The connection segment CS11 is connected between the segments S12 and S13. In one embodiment, the connection segment CS11 is formed in a metal layer which is different from as the metal layer having the segments S12 and S13. For example, the connection segment CS11 may be formed in the metal layer 120, and the segments S12 and S13 may be formed in the metal layer 130. In this case, the segments S12 and S13 are electrically connected to the connection segment CS11 formed in the metal layer 120 via the holes V7 and V8 respectively. In another embodiment, the connection segment CS11, the segments S12 and S13 are disposed in the same metal layer, such as the metal layer 130. Additionally, an angle θ21 is between the connection segment CS11 and the segment S12. An angle θ22 is between the connection segment CS11 and the segment S13. In one embodiment, the angles θ21 and θ22 are greater than 90 degrees. In one embodiment, the angle θ21 is equal to the angle θ22.

The segment S14 is extended along the boundary B15. In this embodiment, the segment S14 is parallel to the boundary B15. The connection segment CS12 is connected between the segments S13 and S14. In one embodiment, the connection segment CS12 is formed in a metal layer which is the same as the metal layer having the segments S13 and S14. In one embodiment, the connection segment CS12, the segments S13 and S14 are disposed in the metal layer 130. In another embodiment, the metal layer comprising the connection segment CS12 is different from the metal layer comprising the segments S13 and S14. An angle θ23 is between the connection segment CS12 and the segment S13. An angle θ24 is between the connection segment CS12 and the segment S14. In one embodiment, the angles θ23 and θ24 are greater than 90 degrees. In one embodiment, the angle θ23 is equal to the angle θ24.

The segment S15 is extended along the boundary B2. In this embodiment, the segment S15 is parallel to the boundary B2. The connection segment CS13 is connected between the segments S14 and S15. In one embodiment, the connection segment CS13 is formed in a metal layer which is the same as the metal layer having the segments S14 and S15, but the disclosure is not limited thereto. In other embodiments, the metal layer comprising the connection segment CS13 is different from the metal layer comprising the segments S14 and S15. For example, the connection segment CS13 may be formed in the metal layer 120, and the segments S14 and S15 may be formed in the metal layer 130. Furthermore, an angle θ24 is between the connection segment CS13 and the segment S14. An angle θ26 is between the connection segment CS13 and the segment S15. In one embodiment, the angles θ25 and θ26 are greater than 90 degrees. In one embodiment, the angle θ25 is equal to the angle θ26.

The segment S16 is extended along the boundary B4 and connected to the segment S8. In this embodiment, the segment S16 is parallel to the boundary B4. The connection segment CS16 is connected between the segments S15 and S16. In one embodiment, the connection segment CS16 is formed in a metal layer which is the same as the metal layer having the segments S15 and S16. In one embodiment, the connection segment CS16, the segments S15 and S16 are disposed in the metal layer 130. In another embodiment, the metal layer comprising the connection segment CS16 is different from the metal layer comprising the segments S15 and S16. An angle θ31 is between the connection segment CS16 and the segment S15. An angle θ32 is between the connection segment CS16 and the segment S16. In one embodiment, the angles θ31 and θ32 are greater than 90 degrees. In one embodiment, the angle θ31 is equal to the angle θ32.

The connection segment CS14 is connected between the segments S16 and S8. In one embodiment, the connection segment CS14 is formed in a metal layer which is the same as the metal layer having the segments S16 and S8. In one embodiment, the connection segment CS14, the segments S16 and S8 are disposed in the metal layer 130. In another embodiment, the metal layer comprising the connection segment CS14 is different from the metal layer comprising the segments S16 and S8. An angle θ27 is between the connection segment CS14 and the segment S16. An angle θ28 is between the connection segment CS14 and the segment S8. In this embodiment, the angle θ27 is greater than 90 degrees, and the angle θ28 is less than 90 degrees.

In the present disclosure, the locations of the segments S1~S8 of the first portion 240a of the conducting line 240 and the segments S9~S16 of the second portion 240b of the conducting line 240 are not limited. In one embodiment, the segments S1~S16 are disposed in the same metal layer, such as the metal layer 130. In this case, at least one of the connection segments CS1~CS8 of the first portion 240a of the conducting line 240 and the connection segments CS9~CS16 of the second portion 240b of the conducting line 240 is disposed in another metal layer, such as the metal layer 120. In this case, the segments disposed in the metal layer 130 are electrically connected to the connection segments disposed in the metal layer 120 via the holes.

Figure 3B:
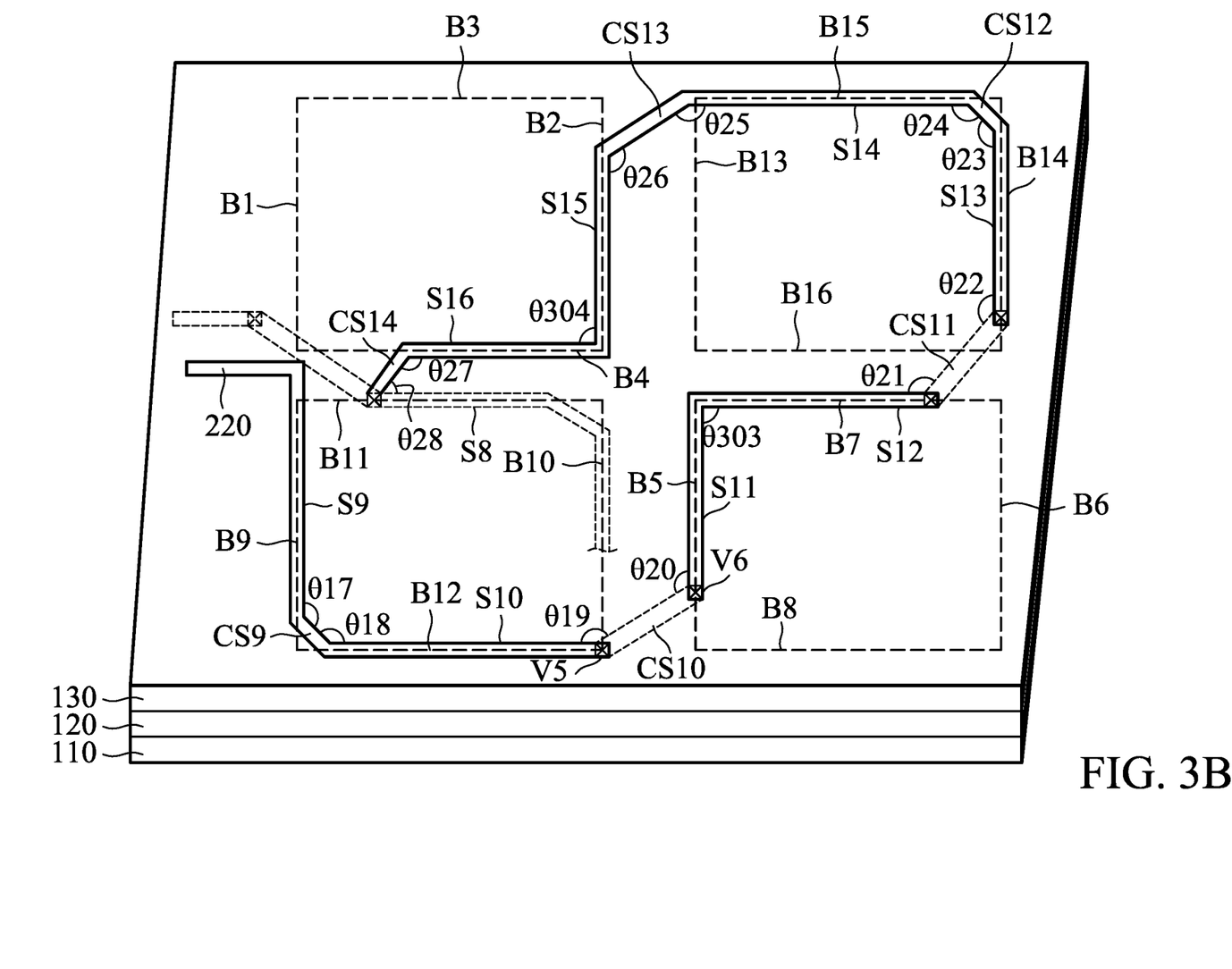
FIG. 3B is a schematic diagram of another exemplary embodiment of the second portion of the conducting line, according to various aspects of the present disclosure.

FIG. 3B is a schematic diagram of another exemplary embodiment of the second portion 240b of the conducting line 240, according to various aspects of the present disclosure. FIG. 3B is similar to FIG. 3A, with the exception that the segment S11 shown in FIG. 3B is directly connected to the segment S12, and the segment S15 is directly connected to the segment S16. In this case, an angle θ303 is between the segments S11 and S12, and an angle θ304 is between the segments S15 and S16. In one embodiment, the angle θ303 is equal to the angle θ304. In another embodiment, the angle θ303 and angle θ304 are equal to 90 degrees.

Figure 3C:
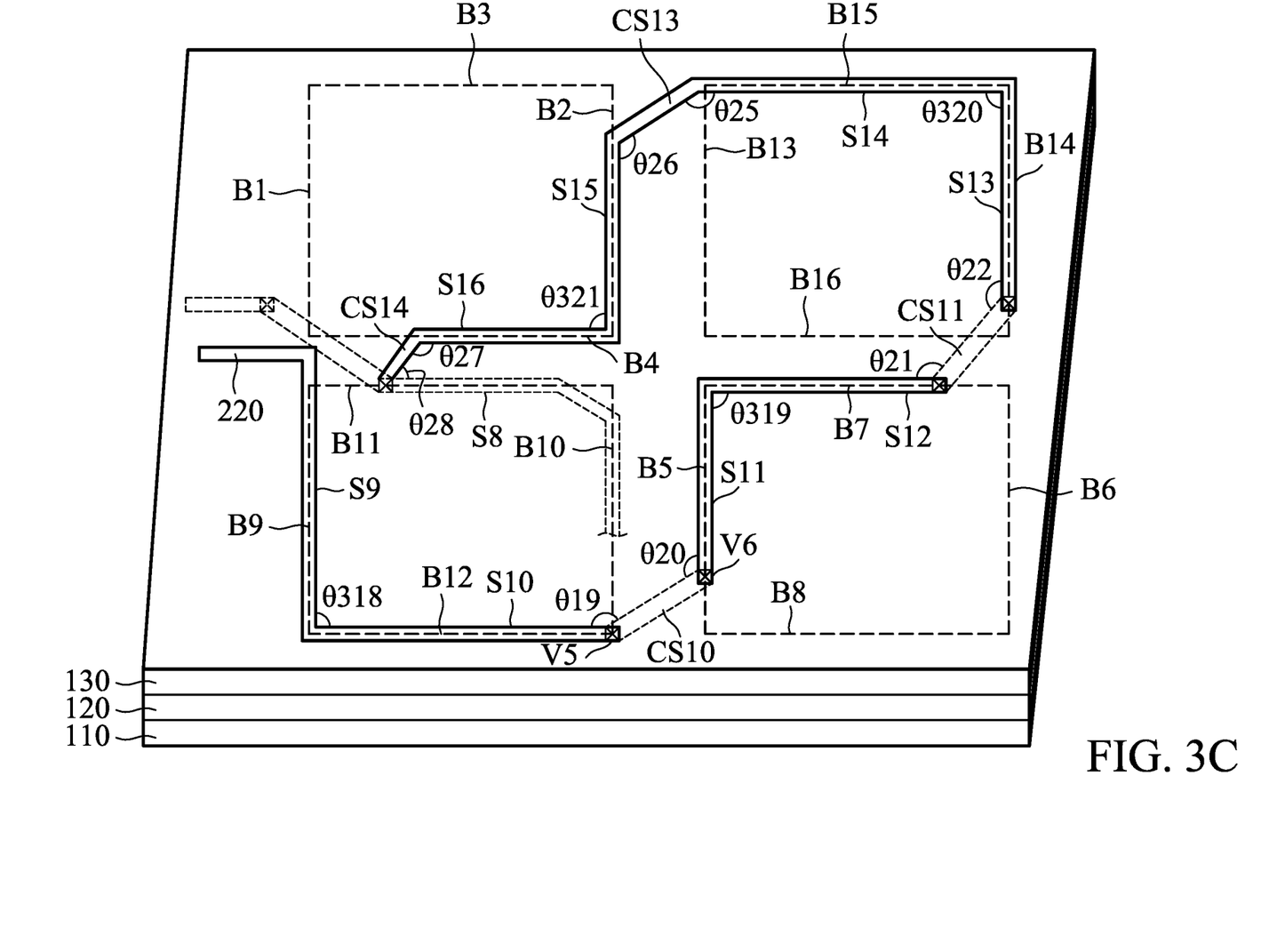
FIG. 3C is a schematic diagram of another exemplary embodiment of the second portion of the conducting line, according to various aspects of the present disclosure.

FIG. 3C is a schematic diagram of another exemplary embodiment of the second portion 230b of the conducting line 240, according to various aspects of the present disclosure. FIG. 3C is similar to FIG. 3A with the exception that the segment S9 is directly connected to the segment S10, the segment S11 is directly connected to the segment S12, the segment S13 is directly connected to the segment S14, and the segment S15 is directly connected to the segment S16. In this embodiment, an angle θ318 is between the segments S9 and S10, an angle θ319 is between the segments S11 and S12, an angle θ320 is between the segments S13 and S14, and an angle θ321 is between the segments S15 and S16. In this embodiment, the angles θ318~θ321 are the same. In one embodiment, the angles θ318~θ321 are equal to 90 degrees, but the disclosure is not limited thereto. In other embodiments, at least one of the angles θ318~θ321 is not equal to another of the angles θ318~θ321.

In this embodiment, the segments S9~S16, the connection segments CS13 and CS14 are disposed in the metal layer 130, and the connection segments CS10 and CS11 are disposed in the metal layer 130. In other embodiments, the segments S9~S16 are disposed in the metal layer 130, and at least one of the connection segments CS10, CS11, CS13 and CS14 is disposed in the metal layer 120. Since the features of the connection segments CS10, CS11, CS13 and CS14 shown in FIG. 3C are the same as the features of the connection segments CS10, CS11, CS13 and CS14 shown in FIG. 3A, the descriptions of the connection segments CS10, CS11, CS13 and CS14 shown in FIG. 3C are omitted.

Figure 4:
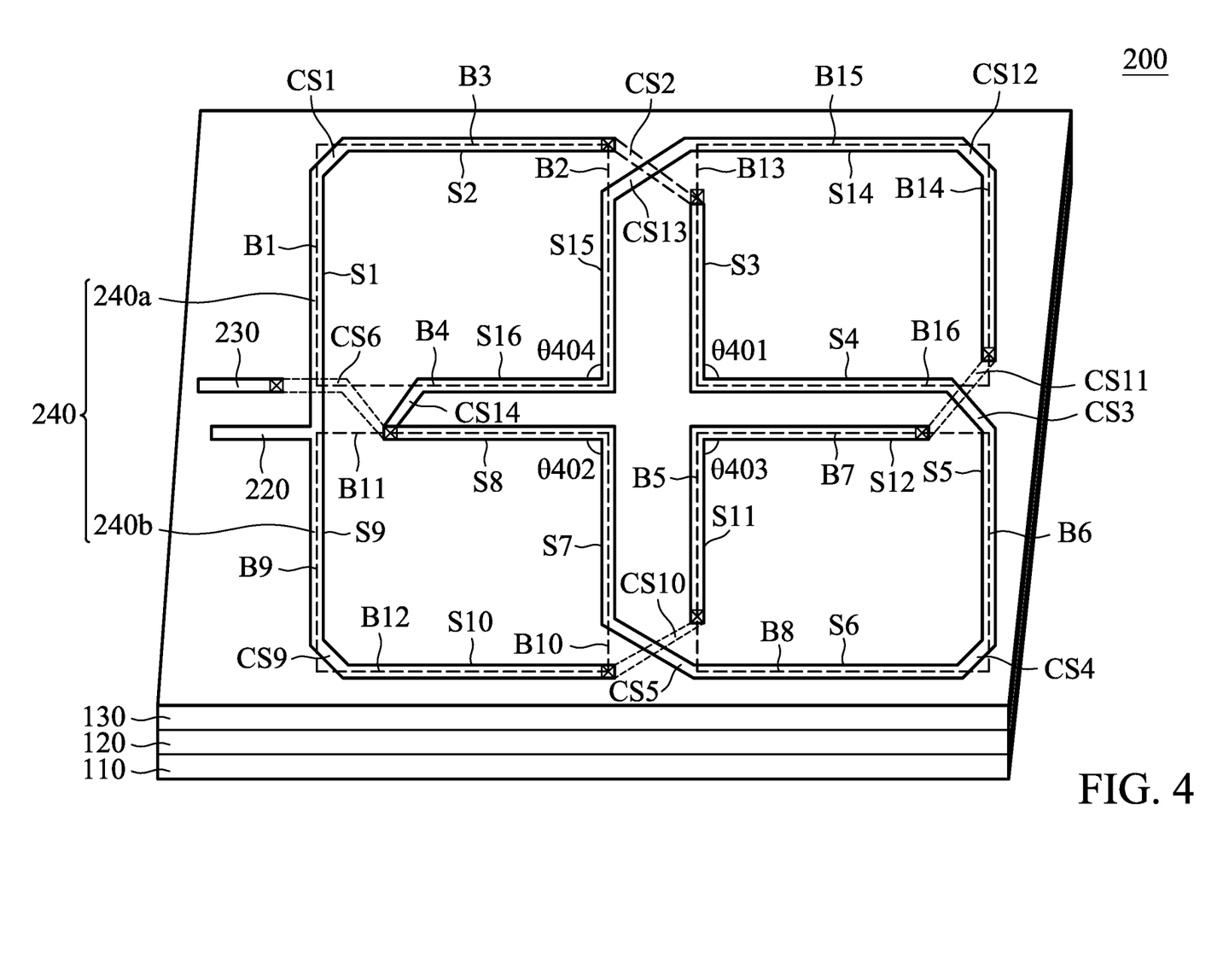
FIG. 4 is a schematic diagram of another exemplary embodiment of the inductor structure, according to various aspects of the present disclosure.

FIG. 4 is a schematic diagram of another exemplary embodiment of the inductor structure, according to various aspects of the present disclosure. FIG. 4 is similar to FIG. 1 with the exception that the segment S3 is directly connected to the segment S4, the segment S7 is directly connected to the segment S8, the segment S11 is directly connected to the segment S12, and the segment S15 is directly connected to the segment S16. An angle θ401 is between the segments S3 and S4. An angle θ402 is between the segments S7 and S8. An angle θ403 is between the segments S11 and S12. An angle θ404 is between the segments S15 and S16. In this embodiment, the angles θ401~θ404 are the same. In one embodiment, the angles θ401~θ404 are approximately equal to 90 degrees. In some embodiments, one of the angles θ401~θ404 may be greater than or less than another of the angles θ401~θ404.

In some embodiments, the connection segments CS1, CS4, CS9 and CS12 are omitted. Therefore, the segment S1 is directly connected to the segment S2, the segment S5 is directly connected to the segment S6, the segment S9 is directly connected to the segment S10, and the segment S13 is directly connected to the segment S14. In this case, the angle between the segments S1 and S2 is equal to the angle between the segments S5 and S6, the angle between the segments S5 and S6 is equal to the angle between the segments S9 and S10, and the angle between the segments S9 and S10 is equal to the angle between the segments S13 and S14.

Figure 5:
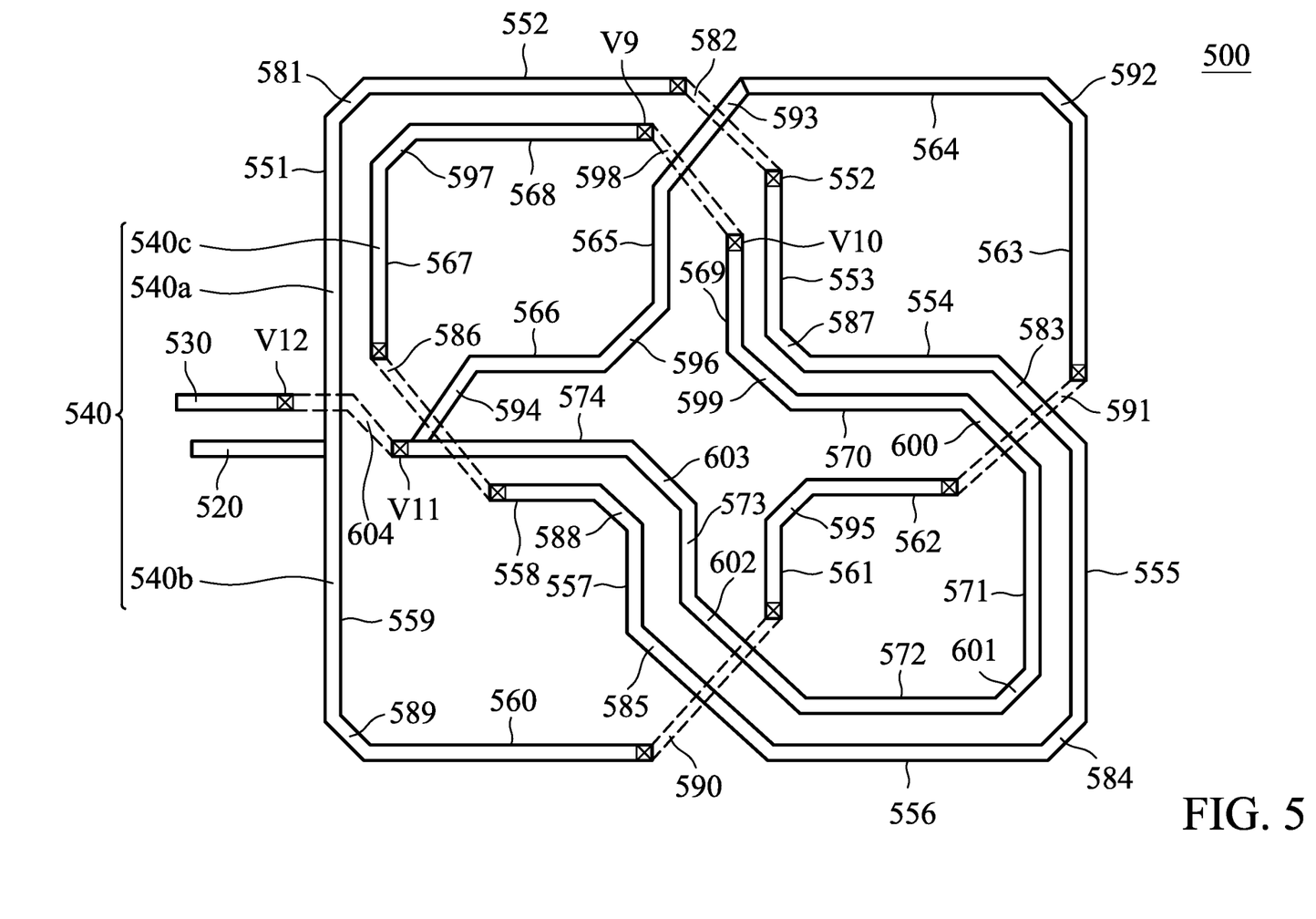
FIG. 5 is a schematic diagram of another exemplary embodiment of the inductor structure, according to various aspects of the present disclosure.
Figure 6:
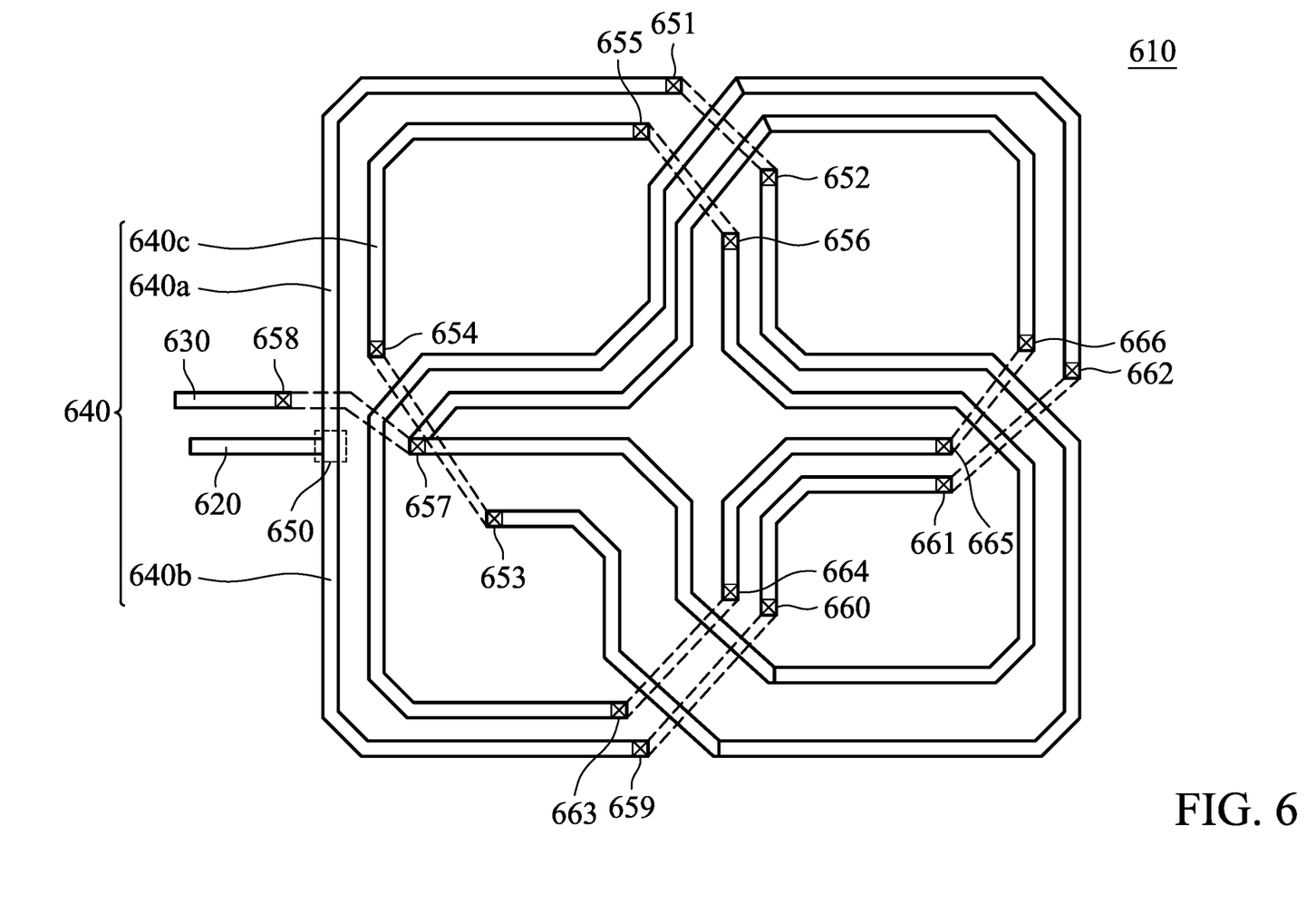
FIG. 6 is a schematic diagram of another exemplary embodiment of the inductor structure, according to various aspects of the present disclosure.
Figure 7:
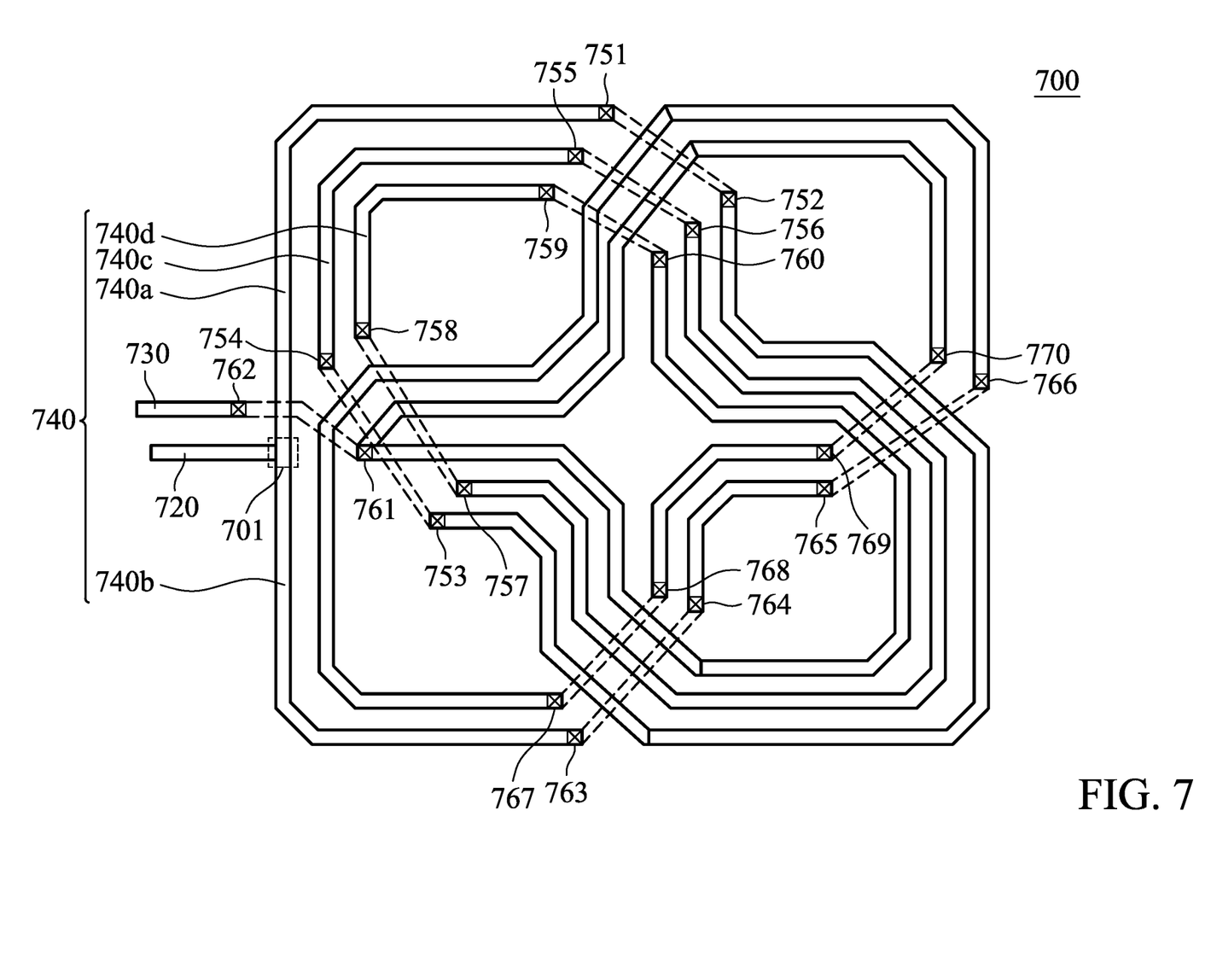
FIG. 7 is a schematic diagram of another exemplary embodiment of the inductor structure, according to various aspects of the present disclosure.

FIGS. 5-7 are schematic diagrams of exemplary embodiments of the inductor structure, according to various aspects of the present disclosure. As illustrated in FIG. 5, the inductor structure 500 comprises an input conducting line 520, an output conducting line 530 and a conducting line 540. In this embodiment, the conducting line 540 comprises a first portion 540a, a second portion 540b and a third portion 540c. The first portion 540a of the conducting line 540 is similar to the first portion 240a of the conducting line 240 shown in FIG. 2A with the exception that the connection segment 586 of the first portion 540a shown in FIG. 5 is connected to the third portion 540c. Since the features of the segments 551~558 and the connection segments 581~585, 587 and 588 of the first portion 540a of the conducting line 540 are the same as the features of the segments S1~S8 and the connection segments CS1~CS5, CS6 and CS7 of the first portion 240a of the conducting line 240 shown in FIG. 2A, the descriptions of the features of the segments 551~558 and the connection segments 581~585, 587 and 588 of the first portion 540a of the conducting line 540 are omitted.

Furthermore, the second portion 540b of the conducting line 540 is similar to the second portion 240b of the conducting line 240 shown in FIG. 2A with the exception that the connection segment 594 of the second portion 540b is connected to the segment 574 of the third portion 540c. Since the features of segments 559~566 and connection segments 589~583, 595 and 596 of the second portion 540b are the same as the features of segments S9~S16 and connection segments CS9~CS13, CS15 and CS16 shown in FIG. 2A, the descriptions of the features of segments 559~566 and connection segments 589~593, 595 and 596 of the second portion 540b are omitted.

In this embodiment, the third portion 540c comprises segments 567~574 and connection segments 597~604. As shown in FIG. 5, the segments 567~574 are parallel to the segments 551~558. The connection segment 597 is connected to the segments 567 and 568 and parallel to the connection segment 581. The features of the connection segment 597 are similar to those of connection segment 581, so a description of the features of connection segment 597 is omitted.

The connection segment 598 is connected to the segments 568 and 569 via the holes V9 and V10. In this embodiment, the connection segment 598 is disposed in a metal layer that is different from the metal layer comprising the segments 568 and 569, but the disclosure is not limited thereto. In some embodiments, the connection segment 598 is disposed in a metal layer that is the same as the metal layer comprising the segments 568 and 569. In one embodiment, the connection segment 568 is parallel to the connection segment 581.

The connection segment 599 is connected to the segments 569 and 570 and parallel to the connection segment 587. Since the features of the connection segment 599 are the same as the features of the connection segment 587, the descriptions of the features of the connection segment 599 are omitted. The connection segment 600 is connected to the segments 570 and 571 and parallel to the connection segment 583. The features of the connection segment 600 are the same as the features of the connection segment 583, so the descriptions of the features of the connection segment 600 are omitted. The connection segment 601 is connected to the segments 571 and 572 and parallel to the conducting line 584. Since the features of the conducting line 601 are the same as the features of the conducting line 584, the descriptions of the features of the conducting line 601 are omitted. The conducting line 602 is connected to the segments 572 and 573 and parallel to the connection segment 585. Since the features of the connection segment 602 are the same as the features of the connection segment 585, the description of the features of the connection segment 602 is omitted. The connection segment 603 is connected to the segments 573 and 574 and parallel to the connection segment 588. Since the features of the connection segment 603 are the same as the features of connection segment 588, the description of the features of connection segment 603 is omitted. The connection segment 604 is connected to segment 574 and the output conducting line 530 via the holes V11 and V12. Since the features of connection segment 604 are the same as the features of connection segment CS6 shown in FIG. 2A, the description of the features of connection segment 604 is omitted. In this embodiment, the length of the conducting line 540 is longer than the length of the conducting line 240 of FIG. 1. Therefore, the inductance of the inductor structure 500 is greater than the inductance of the inductor structure 200.

In FIG. 6, the inductor structure 610 comprises an input conducting line 620, an output conducting line 630 and a conducting line 640. The conducting line 640 comprises a first portion 640a, a second portion 640b and a third portion 640c. The input conducting line 620 is electrically connected to a start end 650. The output conducting line 630 is electrically connected to the hole 658. The first portion 640a is extended from the start end 650 and passes through holes 651~653 to end in the hole 654. The third portion 640c is extended from the hole 654, passes through the holes 655~657 and finally ends in the hole 658. The second portion 640b is extended from the start end, passes through the holes 659~666 and ends in the hole 657. Since the features of the conducting line 640 are the same as those of conducting line 240 shown in the FIG. 1, the description of the features of the conducting line 640 is omitted. In this embodiment, the length of the conducting line 640 is longer than the length of the conducting line 540 shown in FIG. 5. Therefore, the inductance of the inductor structure 610 is greater than the inductance of the inductor structure 500.

In FIG. 7, the inductor structure 700 comprises an input conducting line 720, an output conducting line 730 and a conducting line 740. The input conducting line 720 is electrically connected to a start end 701. The output conducting line 730 is electrically connected to the hole 762. The conducting line 740 comprises a first portion 740a, a second portion 740b, a third portion 740c and a fourth portion 740d.

The first portion 740a is extended from the start end 701, then passes through the holes 751~753 and finally ends in the hole 754. The third portion 701 is extended from the hole 754, passes through the holes 755~757 and finally ends in the hole 758. The fourth portion 740d is extended from the hole 758, passes through the holes 759~761 and finally ends in hole 762. The second portion 740b is extended from the start end 701, passes through the holes 763~770 and finally ends in the hole 761. Since the features of the conducting line 740 are the same as those of conducting line 240 shown in FIG. 1, the description of the features of the conducting line 740 is omitted. In this embodiment, the length of the conducting line 740 is longer than the length of the conducting line 640 shown in FIG. 6, and the inductance of the inductor structure 700 is greater than the inductance of the inductor structure 610.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An inductor structure formed on a substrate and disposed in a first region, a second region, a third region and a fourth region, wherein the first region comprises a first boundary, a second boundary, a third boundary and a fourth boundary, the second region comprises a fifth boundary, a sixth boundary, a seventh boundary and an eighth boundary, the third region comprises a ninth boundary, a tenth boundary, an eleventh boundary and a twelfth boundary, and the fourth region comprises a thirteenth boundary, a fourteenth boundary, a fifteenth boundary and a sixteenth boundary, comprising:
   a first conducting line;
   a second conducting line; and
   a third conducting line connected between the first conducting line and the second conducting line and comprising:
      a first portion sequentially extended along the first, the third, the thirteenth, the sixteenth, the sixth, the eighth, the tenth and the eleventh boundaries; and
      a second portion sequentially extended along the ninth, the twelfth, the fifth, the seventh, the fourteenth, the fifteenth, the second and the fourth boundaries,
   wherein the first boundary is parallel to the second boundary, the third boundary is parallel to the fourth boundary, and the first and second boundaries are vertical to the third and the fourth boundaries,
   wherein the fifth boundary is parallel to the sixth boundary, the seventh boundary is parallel to the eighth boundary, and the fifth and sixth boundaries are vertical to the seventh and the eighth boundaries,
   wherein the ninth boundary is parallel to the tenth boundary, the eleventh boundary is parallel to the twelfth boundary, and the ninth and tenth boundaries are vertical to the eleventh and the twelfth boundaries, and wherein the thirteenth boundary is parallel to the fourteenth boundary, the fifteenth boundary is parallel to the sixteenth boundary, and the thirteenth and fourteenth boundaries are vertical to the fifteenth and the sixteenth boundaries, wherein the first portion of the third conducting line comprises a first segment directly connected to the first conducting line and extended along the first boundary, and the second portion of the third conducting line comprises a ninth segment directly connected to the first conducting line and extended along the ninth boundary.

2. The inductor structure as claimed in claim 1, wherein the first portion of the third conducting line comprises:
a second segment extended along the third boundary;
a third segment extended along the thirteenth boundary;
a fourth segment extended along the sixteenth boundary;
a fifth segment extended along the sixth boundary;
a sixth segment extended along the eighth boundary;
a seventh segment extended along the tenth boundary; and
an eighth segment extended along the eleventh boundary and connected to the second conducting line.

3. The inductor structure as claimed in claim 2,
wherein the second segment is directly connected to the first segment, the third segment is directly connected to the fourth segment, the fifth segment is directly connected to the sixth segment, and the seventh segment is directly connected to the eighth segment, and
wherein an angle between the first and second segments is equal to an angle between the third and fourth segments, the angle between the third and fourth segments is equal to an angle between the fifth and sixth segments, and the angle between the fifth and sixth segments is equal to an angle between the seventh and eighth segments.

4. The inductor structure as claimed in claim 3, wherein the angle between the first and second segments is equal to 90 degrees.

5. The inductor structure as claimed in claim 2, wherein the first portion of the third conducting line further comprises:
a first connection segment connected between the first and second segments, wherein a first angle is between the first connection segment and the first segment, and a second angle is between the first connection segment and the second segment;
a second connection segment connected between the second and third segments, wherein a third angle is between the second connection segment and the second segment, and a fourth angle is between the second connection segment and the third segment;
a third connection segment connected between the fourth and fifth segments, wherein a fifth angle is between the third connection segment and the fourth segment, and a sixth angle is between the third connection segment and the fifth segment;
a fourth connection segment connected between the fifth and sixth segments, wherein a seventh angle is between the fourth connection segment and the fifth segment, and an eighth angle is between the fourth connection segment and the sixth segment;
a fifth connection segment connected between the sixth and seventh segments, wherein a ninth angle is between the fifth connection segment and the sixth segment, and a tenth angle is between the fifth connection segment and the seventh segment; and
a sixth connection segment connected between the eighth segment and the second conducting line, wherein an eleventh angle is between the sixth connection segment and the eighth segment, and a twelfth angle is between the sixth connection segment and the second conducting line, wherein each of the first, second, third, fourth, fifth, sixth, seventh, eighth, ninth, tenth, eleventh and twelfth angles is greater than 90 degrees.

6. The inductor structure as claimed in claim 5, wherein the third segment is directly connected to the fourth segment, the seventh segment is directly connected to the eighth segment, and an angle between the third and fourth segments is equal to an angle between the seventh and eighth segments.

7. The inductor structure as claimed in claim 6, wherein the angle between the third and fourth segments is equal to 90 degrees.

8. The inductor structure as claimed in claim 5, wherein the first portion of the third conducting line further comprises:
a seventh connection segment connected between the third and fourth segments, wherein a thirteenth angle is between the seventh connection segment and the third segment, and a fourteenth angle is between the seventh connection segment and the fourth segment; and
an eighth connection segment connected between the seventh and eighth segments, wherein a fifteenth angle is between the eighth connection segment and the seventh segment, and a sixteenth angle is between the eighth connection segment and the eighth segment, wherein each of the thirteenth, fourteenth, fifteenth and sixteenth angles is greater than 90 degrees.

9. The inductor structure as claimed in claim 5, wherein the first, second, third, fourth, fifth, sixth, seventh and eighth segments are disposed in a first metal layer, at least one of the first, second, third, fourth, fifth, sixth, seventh and eighth connection segments is disposed in a second metal layer, and the second metal layer is disposed between the substrate and the first metal.

10. The inductor structure as claimed in claim 5, wherein the second portion of the third conducting line comprises:
a tenth segment extended along the twelfth boundary;
an eleventh segment extended along the fifth boundary;
a twelfth segment extended along the seventh boundary;
a thirteenth segment extended along the fourteenth boundary;
a fourteenth segment extended along the fifteenth boundary;
a fifteenth segment extended along the second boundary; and
a sixteenth segment extended along the fourth boundary and connected to the eighth segment.

11. The inductor structure as claimed in claim 10,
wherein the tenth segment is directly connected to the ninth segment, the eleventh segment is directly connected to the twelfth segment, the thirteenth segment is directly connected to the fourth segment, and the fifteenth segment is directly connected to the sixteenth segment, and
wherein an angle between the ninth and tenth segments is equal to an angle between the eleventh and twelfth segments, the angle between the eleventh and twelfth segments is equal to an angle between the thirteenth and fourteenth segments, and the angle between the thirteenth and fourteenth segments is equal to an angle between the fifteenth and sixteenth segments.

12. The inductor structure as claimed in claim 11, wherein the angle between the ninth and tenth segments is equal to 90 degrees.

13. The inductor structure as claimed in claim 10, wherein the second portion of the third conducting line further comprises:
  a ninth connection segment connected between the ninth and tenth segments, wherein a seventeenth angle is between the ninth connection segment and the ninth segment, and an eighteenth angle is between the ninth connection segment and the tenth segment;
  a tenth connection segment connected between the tenth and eleventh segments, wherein a nineteenth angle is between the tenth connection segment and the tenth segment, and a twentieth angle is between the tenth connection segment and the eleventh segment;
  an eleventh connection segment connected between the twelfth and thirteenth segments, wherein a twenty-first angle is between the eleventh connection segment and the twelfth segment, and a twenty-second angle is between the eleventh connection segment and the thirteenth segment;
  a twelfth connection segment connected between the thirteenth and fourteenth segments, wherein a twenty-third angle is between the twelfth connection segment and the thirteenth segment, and a twenty-fourth angle is between the twelfth connection segment and the fourteenth segment;
  a thirteenth connection segment connected between the fourteenth and fifteenth segments, wherein a twenty-fifth angle is between the thirteenth connection segment and the fourteenth segment, and a twenty-sixth angle is between the thirteenth connection segment and the fifteenth segment;
  a fourteenth connection segment connected between the sixteenth and eighth segments, wherein a twenty-seventh angle is between the fourteenth connection segment and the sixteenth segment, and a twenty-eighth angle is between the fourteenth connection segment and the eighth segment,
  wherein each of the seventeenth, eighteenth, nineteenth, twentieth, twenty-first, twenty-second, twenty-third, twenty-fourth, twenty-fifth, twenty-sixth and twenty-seventh angles is greater than 90 degrees, and the twenty-eighth angle is less than 90 degrees.

14. The inductor structure as claimed in claim 13, wherein the eleventh segment is directly connected to the twelfth segment, the fifteenth segment is directly connected to the sixteenth segment, and an angle between the eleventh and twelfth segments is equal to an angle between the fifteenth and sixteenth segments.

15. The inductor structure as claimed in claim 14, wherein an angle between the eleventh and twelfth segments is equal to 90 degrees.

16. The inductor structure as claimed in claim 13, wherein the second portion of the third conducting line further comprises:
  a fifteenth connection segment connected between the eleventh and twelfth segments, wherein a twenty-ninth angle is between the fifteenth connection segment and the eleventh segment, and a thirtieth angle is between the fifteenth connection segment and the twelfth segment; and
  a sixteenth connection segment connected between the fifteenth and sixteenth segments, wherein a thirty-first angle is between the sixteenth connection segment and the fifteenth segment, and a thirty-second angle is between the sixteenth connection segment and the sixteenth segment,
  wherein each of the twenty-ninth, thirtieth, thirty-first, and thirty-second angles is greater than 90 degrees.

17. The inductor structure as claimed in claim 13, wherein the first, second, third, fourth, fifth, sixth, seventh, eighth, ninth, tenth, eleventh, twelfth, thirteenth, fourteenth, fifteenth and sixteenth segments are disposed in a first metal layer, at least one of the first, second, third, fourth, fifth, sixth, seventh, eighth, ninth, tenth, eleventh, twelfth, thirteenth, fourteenth, fifteenth and sixteenth connection segments is disposed in a second metal layer, and the second metal layer is disposed between the substrate and the first metal layer.

* * * * *